United States Patent
Sandhu et al.

[19]

[11] Patent Number: 6,090,708
[45] Date of Patent: *Jul. 18, 2000

[54] METHOD OF FORMING A CRYSTALLINE PHASE MATERIAL, ELECTRICALLY CONDUCTIVE LINE AND REFRACTORY METAL SILICIDE

[75] Inventors: Gurtej S. Sandhu; Chris Hill; Sujit Sharan, all of Boise, Id.

[73] Assignee: Micron Technology, Inc., Boise, Id.

[ * ] Notice: This patent is subject to a terminal disclaimer.

[21] Appl. No.: 09/028,127

[22] Filed: Feb. 23, 1998

Related U.S. Application Data

[63] Continuation-in-part of application No. 08/748,997, Nov. 14, 1996, Pat. No. 5,997,634.

[51] Int. Cl.$^7$ .................................................. H01L 21/44
[52] U.S. Cl. ........................... 438/683; 438/649; 438/655
[58] Field of Search .................................. 438/648, 649, 438/655, 656, 682, 683

[56] References Cited

U.S. PATENT DOCUMENTS

| | | | |
|---|---|---|---|
| 4,568,565 | 2/1986 | Gupta et al. | 427/53.1 |
| 4,971,655 | 11/1990 | Stefano et al. | 156/659.1 |
| 5,240,739 | 8/1993 | Doan et al. | 427/126.1 |
| 5,376,405 | 12/1994 | Doan et al. | 427/126.1 |
| 5,997,634 | 12/1999 | Sandhu et al. | 117/3 |

OTHER PUBLICATIONS

Ilderem, V., et al., "Optimized Deposition Parameters For Low Pressure Chemical Vapor Deposited Titanium Silicide", *Massachusetts Institute of Technology*, vol. 135, No10, pp. 2590–2596 (Feb. 1988). .

Nagabushnam, R.V., "Kinetics And Mechanism Of The C49 to C54 Titanium Disilicide Phase Transformation Formation In Nitrogen Ambient", 5 Pages (Nov. 1995).

*Primary Examiner*—Kevin M. Picardat
*Attorney, Agent, or Firm*—Wells, St. John, Roberts, Gregory & Matkin P.S.

[57] ABSTRACT

A method of forming a crystalline phase material includes providing a stress inducing material on a substrate and, after providing the stress inducing material on the substrate, depositing a crystalline phase material over the substrate in a substantially continuous manner and changing deposition temperature at least once during the depositing, and forming the second crystalline phase of the crystalline phase material. In accordance another aspect, a method is performed by providing a stress inducing material on a substrate and, after providing the stress inducing material on the substrate, forming a crystalline phase material over the substrate in at least two discrete crystalline phase material depositions, a later of the depositions being conducted at a different temperature from an earlier of the depositions and forming the second crystalline phase of the crystalline phase material. In another aspect, a method is performed by forming a refractory metal silicide layer of C54 crystalline phase on a substrate, and depositing refractory metal silicide material onto the C54 refractory metal silicide layer with the C54 crystalline phase being induced into the refractory metal silicide material from the C54 crystalline phase in the refractory metal silicide layer.

77 Claims, 4 Drawing Sheets

6,090,708

METHOD OF FORMING A CRYSTALLINE PHASE MATERIAL, ELECTRICALLY CONDUCTIVE LINE AND REFRACTORY METAL SILICIDE

This patent resulted from a continuation-in-part application of U.S. patent application Ser. No. 08/748,997, filed on Nov. 14, 1996, listing inventors as Gurtej S. Sandhu and Sujit Sharan, and entitled "Method Of Forming A Crystalline Phase Material" now U.S. Pat. No. 5,997,634. Such is provided herewith as an appendix.

TECHNICAL FIELD

This invention relates generally to formation of crystalline phase materials in semiconductor wafer processing and more particularly to formation of refractory metal suicides and crystalline phase transformation thereof as well as to conductive lines incorporating such materials.

BACKGROUND OF THE INVENTION

Silicides, such as titanium silicide and tungsten silicide, are commonly utilized electrically conductive materials in semiconductor wafer integrated circuitry fabrication. Such materials are utilized, for example, as capping layers over underlying conductively doped polysilicon material to form electrically conductive lines or interconnects. Such silicide materials are also utilized at contact bases intermediate an underlying silicon substrate and overlying conductive polysilicon contact plugging material. Silicides can be provided by chemical vapor deposition, or by deposition of elemental titanium or tungsten over an underlying silicon surface. Subsequent high temperature annealing causes a chemical reaction of the tungsten or titanium with the underlying silicon to form the silicide compound.

Titanium silicide ($TiSi_2$) occurs in two different crystalline structures or phases referred to as the C49 and C54 phase. The C49 structure is base-centered orthorhombic, while the C54 is face-centered orthorhombic. The C54 phase occurs in the binary-phase diagram while the C49 phase does not. The C49 phase is therefor considered to be metastable. The C54 phase is a densely packed structure having 7% less volume than the C49 phase. The C54 phase also has lower resistivity (higher conductivity) than the C49 phase.

The C49 phase forms at lower temperatures during a typical refractory metal silicide formation anneal (i.e. at from 500° C.–600° C.) and transforms to the C54 phase at higher elevated temperatures (i.e., greater than or equal to about 650° C.). The formation of the higher resistive C49 phase has been observed to be almost inevitable due to the lower activation energies associated with it (2.1–2.4 eV) which arises from the lower surface energy of the C49 phase compared to that of the more thermodynamically stable C54 phase. Hence, the desired C54 phase can be obtained by transforming the C49 phase at elevated temperatures.

Due at least in part to its greater conductivity, the C54 phase is much more desirable as contact or conductive line cladding material. Continued semiconductive wafer fabrication has achieved denser and smaller circuitry making silicide layers thinner and narrower in each subsequent processing generation. As the silicide layers become thinner and narrower, the ratio of surface area to volume of material to be transformed from the C49 to the C54 phase increases. This requires ever increasing activation energies to cause the desired transformation, which translates to higher anneal temperatures to effect the desired phase transformation. In some instances, the temperature must be at least equal to or greater than 800° C. Unfortunately, heating a silicide layer to a higher temperature can result in undesired precipitation and agglomeration of silicon in such layer, and also adversely exposes the wafer being processed to undesired and ever increasing thermal exposure. The processing window for achieving or obtaining low resistance silicide phases for smaller line widths and contacts continues to be reduced, making fabrication difficult.

It would be desirable to develop methods which facilitate the C49 to C54 phase transformation in titanium silicide films. It would also be desirable to develop methods which initially, or which appear to initially, form C54 phase titanium silicide during deposition to minimize or eliminate subsequent dedicated or separate anneal processing in separate equipment. Although the invention was developed with an eye towards overcoming this specific problem, the artisan will appreciate applicability of the invention in other areas, with the invention only being limited by the accompanying claims appropriately interpreted in accordance with the Doctrine of Equivalents.

SUMMARY

In but one aspect, the invention provides a method of forming a crystalline phase material capable of first and second crystalline phases, where said first and second phases are of different densities. In one implementation, a method is performed by providing a stress-inducing material on a substrate and, after providing the stress-inducing material on the substrate, depositing a crystalline phase material over the substrate in a substantially continuous manner and changing deposition temperature at least once during the depositing, and forming the second crystalline phase of the crystalline phase material. Where the second density is greater than the first density, the stress inducing material is chosen to impart compressive stress during the temperature changing. Where the second density is less than the first density, the stress inducing material is chosen to impart tensile stress during the temperature changing.

In accordance another aspect, a method is performed by providing a stress-inducing material on a substrate and, after providing the stress-inducing material on the substrate, forming a crystalline phase material over the substrate in at least two discrete crystalline phase material depositions, a later of the depositions being conducted at a different temperature from an earlier of the depositions and forming the second crystalline phase of the crystalline phase material.

In another implementation, a method is performed by forming a refractory metal silicide layer of C54 crystalline phase on a substrate, and depositing refractory metal silicide material onto the C54 refractory metal silicide layer with the C54 crystalline phase being induced into the refractory metal silicide material from the C54 crystalline phase in the refractory metal silicide layer.

In another aspect, the invention provides a method of forming a crystalline phase material capable of first and second crystalline phases, where said second phase is less dense than said first phase. In one implementation, a method is performed by providing a stress-inducing material on a substrate and, after providing the stress-inducing material on the substrate, depositing a crystalline phase material over the substrate in a substantially continuous manner and changing deposition temperature at least once during the depositing, and forming the second crystalline phase of the crystalline phase material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
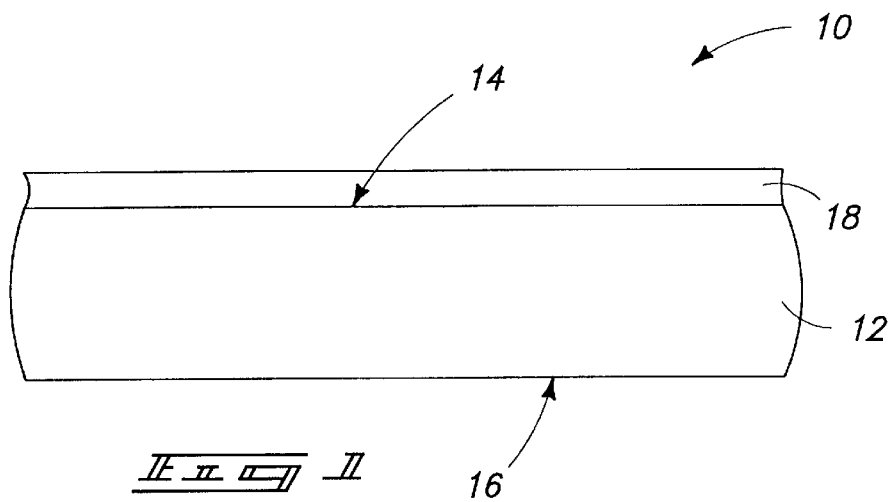
FIG. 1 is a diagrammatic sectional view of a semiconductor wafer fragment at one processing step in accordance with the invention.
Figure 2:
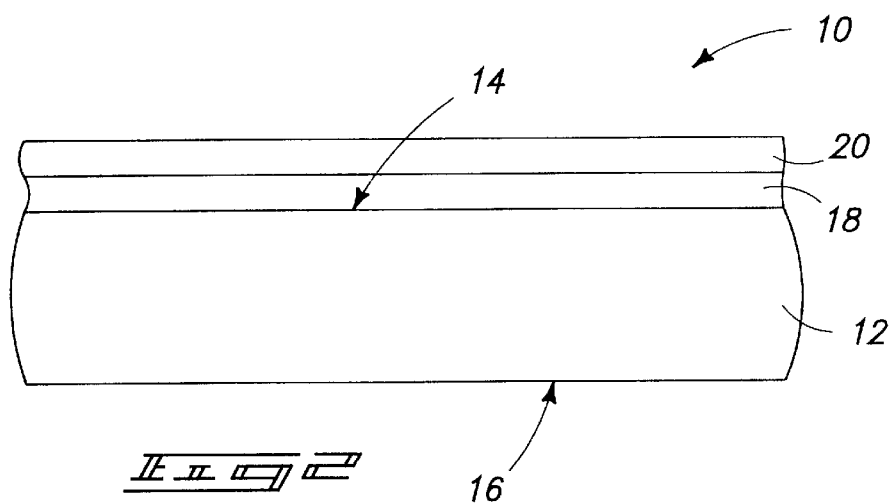
FIG. 2 is a view of the FIG. 1 wafer at a processing step subsequent to that shown by FIG. 1.

Referring initially to FIGS. 1 and 2, a semiconductor wafer fragment in process is indicated generally with reference numeral 10. Such comprises a substrate 12, for example in the form of a bulk monocrystalline silicon wafer. In the context of this document, the term "semiconductive substrate" is defined to mean any construction comprising semiconductive material, including but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 initially comprises opposing first and second sides 14 and 16, respectively. Substrate 10 will be utilized in a method of forming a second crystalline phase material of a crystalline phase material capable of first and second crystalline phases, where the second phase is more dense than the first phase, and where the crystalline material of the first crystalline phase has some thermal coefficient of expansion. An exemplary preferred material is a refractory metal silicide, such as $TiSi_x$.

A stress-inducing material layer 18 is formed over wafer first side 14. In this embodiment, such is fabricated of a material to have a thermal coefficient of expansion which is greater than that of the crystalline material of the first crystalline phase which will be subsequently provided. For example where the crystalline phase material is to be a refractory metal silicide and the first crystalline phase is C49, an exemplary material for layer 18 is TiN deposited by chemical vapor deposition. An exemplary thickness for layer 18 is from 100 Angstroms to 2000 Angstroms. Such thickness is also preferably equal to or greater than a thickness of a first phase crystalline material to be subsequently deposited.

Figure 3:
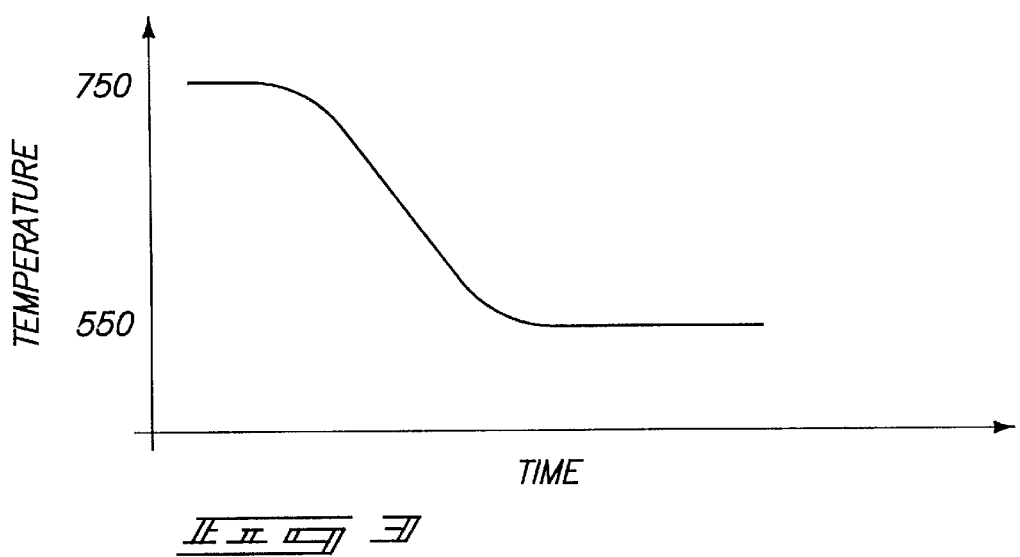
FIG. 3 is a graph of processing conditions as a function of time for an exemplary embodiment of the invention.

Referring to FIG. 2, and after forming stress-inducing material 18, a crystalline phase material 20 is deposited over wafer first side 14 in a substantially continuous manner. During deposition, the deposition temperature is lowered at least once, and the second phase of the crystalline phase material is formed. Such is understood to form from stress induced by layer 18 into layer 20 in situ during deposition of layer 20. For example, FIG. 3 illustrates a graph of temperature versus time for an exemplary deposition of layer 20. One example would be the deposition of $TiSi_2$ deposited by CVD using $TiCl_4$ and $SiH_4$. An exemplary pressure during deposition is 10 Torr. The graph illustrates wafer temperature at the start of deposition as being an exemplary 750° C. Deposition continues in a substantially continuous manner as deposition temperature is lowered to 550° C., and then continues. An example time interval for the lowering of the deposition from 750° C. to 550° C. is one minute. Such is understood to in essence start with C49 phase deposition at the 750° C. temperature, which transforms to C54 phase deposition as the temperature is lowered as a result of stress induction by stress-inducing layer 18. Thus, C54 phase $TiSi_x$ is essentially in situ formed during its deposition, with the initially deposited C49 phase being inherently transformed to C54 phase at the start of or during the temperature lowering cycle.

Figure 4:
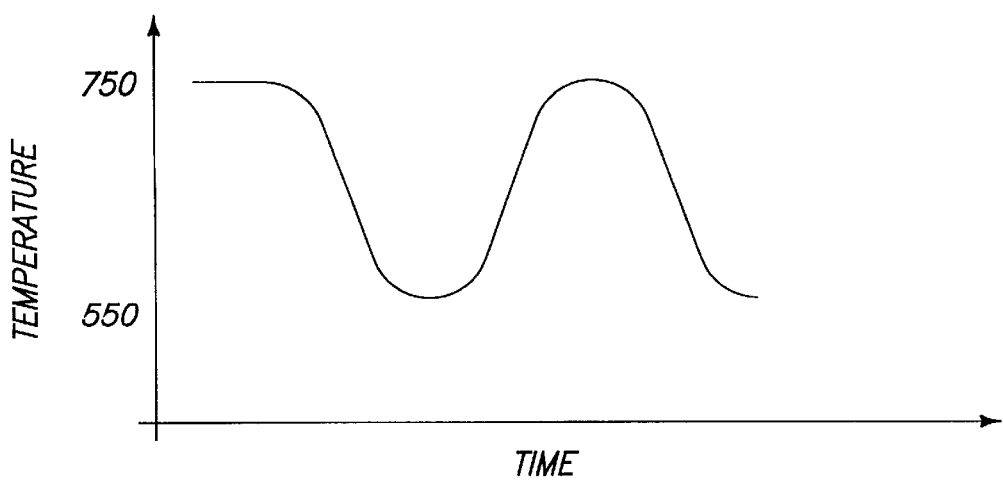
FIG. 4 is a graph of processing conditions as a function of time for another exemplary embodiment of the invention.

FIG. 3 illustrates one example deposition whereby the deposition temperature is changed once during the depositing. FIG. 4 illustrates an alternate exemplary process wherein the deposition temperature is changed more than once during deposition. The illustrated example shows three deposition temperature changes occurring between an initial first higher temperature of 750° C. and a second lower temperature of 550° C., with such occurring during at least a portion of the depositing. During such process, C49 silicide might be formed during temperature reversal from the lower to higher temperature. However even if so, such C49 phase silicon would be converted to C54 phase during the subsequent temperature ramp in the lower direction as a result of stress induction from stress-inducing material layer 18. Preferably, an average of the temperatures during all of the depositing and forming is less than or equal to about 700° C., with an average of 650° C. being shown by the examples of FIGS. 3 and 4. Further, a greater number of deposition temperature changes can occur than is depicted by FIG. 4.

The first-described example provides one example of a stress-inducing material being formed on a substrate, in such instance on first side 14 over which the crystalline phase material is also formed. An alternate embodiment is described with reference to FIG. 5 in connection with a wafer fragment 10a. Like numerals from the first described embodiment are utilized where appropriate, with differences being indicated by the suffix "a", or with different numerals.

Figure 5:
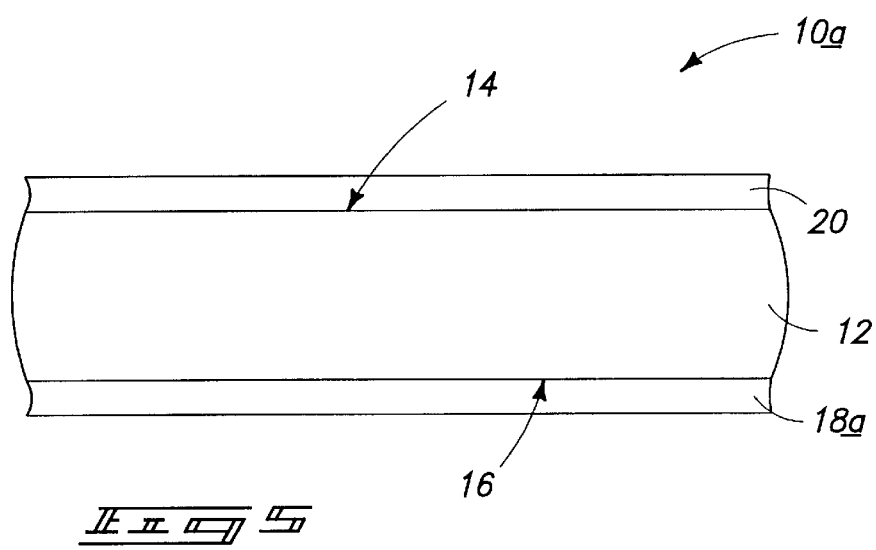
FIG. 5 is a diagrammatic sectional view of another alternate semiconductor wafer fragment at an alternate processing step in accordance with the invention.

In this embodiment, stress-inducing material layer 18a is provided over wafer second side 16. Stress-inducing material 18a in such instance is ideally provided to have a thermal coefficient of expansion which is less than that of the crystalline material of the first crystalline phase. Again where the crystalline phase material is a refractory metal silicide and the first crystalline phase is C49, an example material for layer 18a is $Si_3N_4$ or $SiO_2$. Such can be deposited, for example, by conventional CVD techniques, with layer 18a preferably being provided to a thickness which is equal to or greater than the desired finished thickness of the subsequently deposited crystalline material. For example, FIG. 5 illustrates deposition of layer 20 over wafer front or first side surface 14. Preferably, processing which includes substantially continuous deposition and at least one lowering of temperature from a higher deposition temperature to a lower deposition temperature (such as shown in FIGS. 3 and 4) is conducted as in the first described embodiments. The reversal of the coefficient of expansion of the stress-inducing material versus the first crystalline phase material in combination with provision of such stress-inducing material on the opposite side of the wafer will result in the desired stress induction and ultimate in situ C54 or more dense second phase material.

Figure 6:
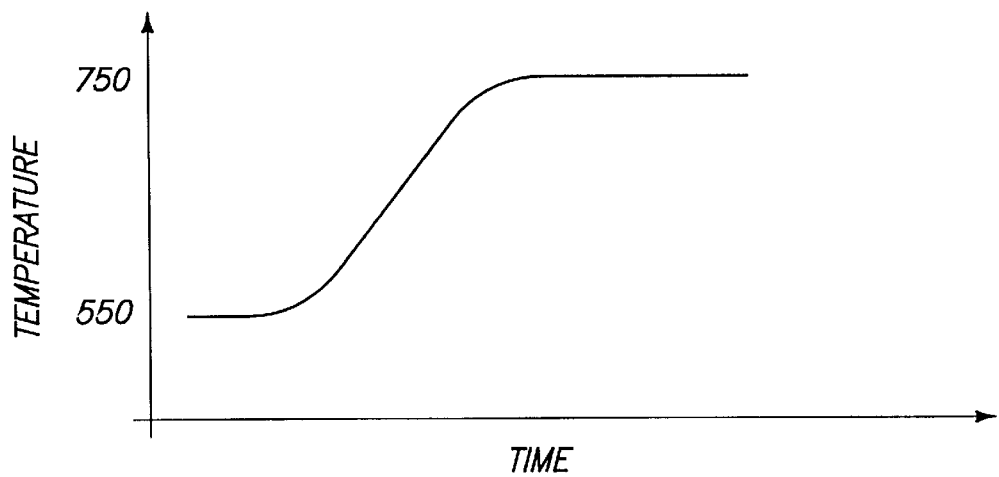
FIG. 6 is a graph of processing conditions as a function of time for yet another exemplary embodiment of the invention.

Another alternate process is described with reference to FIG. 6. Such utilizes the construction relationship of FIG. 2, wherein the stress-inducing material is formed over wafer first side 14. Such stress-inducing material is however provided to have a thermal coefficient of expansion which is less than that of the crystalline material of the first crystalline phase which, following the above examples for a refractory metal silicide, could be $SiO_2$ or $Si_3N_4$. Subsequently, a crystalline phase material is substantially continuously deposited over wafer front side 14 in a manner whereby deposition temperature is raised at least once during the depositing, such as between 550° C. initially and 750° C. later as shown in FIG. 6. Such will result in the same effect as described above, such as formation of C54 phase silicide essentially in situ during deposition.

Figure 7:
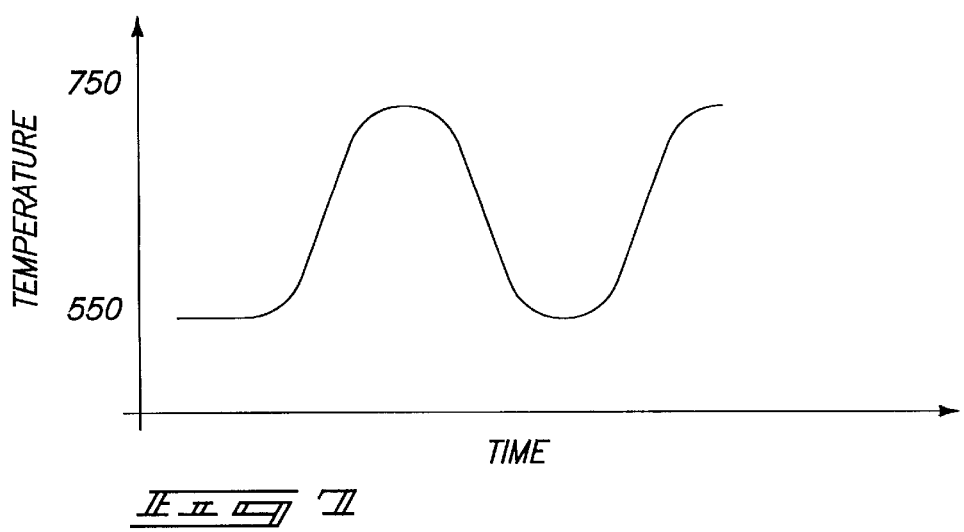
FIG. 7 is a graph of processing conditions as a function of time for still another exemplary embodiment of the invention.

The FIG. 6 deposition illustrates an example one deposition temperature change during deposition. FIG. 7 shows an example wherein deposition temperature is changed at least three times during the depositing. Again, it is anticipated that C49 phase silicide might form during the second temperature change from 750° C. to 550° C. However, such will be transformed to C54 phase silicon during the subsequent ramp(s) from 550° C. to 750° C.

The same FIGS. 6 and 7 processing could be conducted with a construction of FIG. 5 wherein stress inducing material 18a is provided to have a thermal coefficient of expansion which is greater than that of the crystalline material of the first crystalline phase, with TiN being one example material in this instance for refractory metal silicide layer deposition.

All of the above examples refer to methods whereby crystalline phase material is deposited over a substrate in a substantially continuous manner with the deposition temperature being changed at least once, and preferably continuously during the at least one change, during the depositing. Alternate exemplary processing is described initially with reference to FIG. 8. The resultant construction and materials for the FIG. 8 processing would be as depicted in FIG. 2. Yet here, the crystalline phase material deposition is provided in at least two discrete crystalline phase material depositions, wherein a later of the depositions is conducted at a different temperature from an earlier of the depositions.

Figure 8:
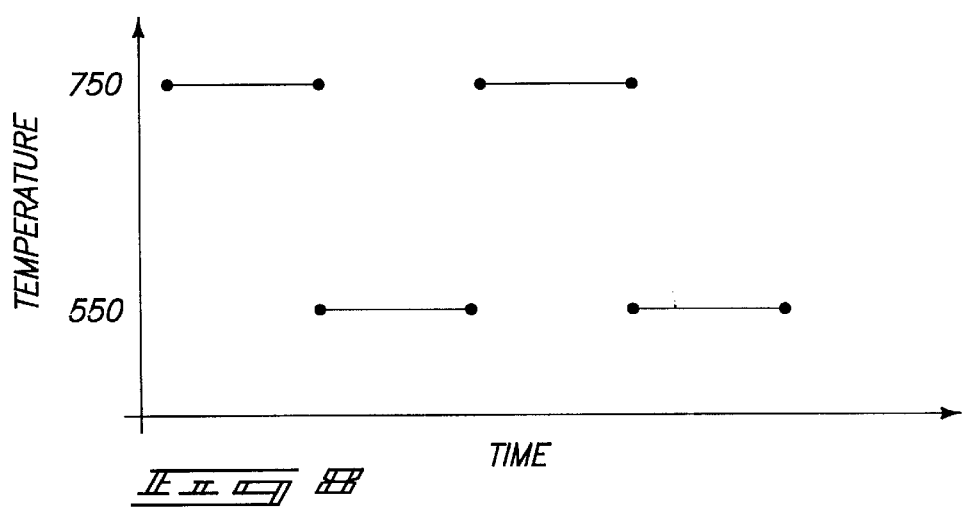
FIG. 8 is a graph of processing conditions as a function of time for a further exemplary embodiment of the invention.

For example in FIG. 8, the stress-inducing material is formed over wafer first side 14 and has a thermal coefficient of expansion which is greater than that of the crystalline material of the first crystalline phase. Deposition of the crystalline phase material initiates at an exemplary temperature of 750° C. and continues for a period of time thereat, and then ceases. Wafer temperature is then lowered, for example, over a one-minute time period to a temperature of 550° C. Thereupon, crystalline phase material deposition continues. Although the initially deposited material at 750° C. will typically comprise C49 phase refractory metal silicide, the resultant temperature lowering will transform such material to C54 phase whereupon subsequent deposition at the lower temperature will inherently form or be seeded by the C54 underlying layer to form the resultant C54 phase silicide in the ensuing deposition. FIG. 8 illustrates an exemplary additional temperature raising and third deposition process whereby further crystalline material is deposited in a discrete step, and thereafter lowered to continue the stress induction in C54 phase formation. Thus, FIG. 8 illustrates in one preferred embodiment at least four depositions comprising at least two different deposition temperatures, with the deposition temperatures being changed three times between the two temperatures and between the four discrete depositions.

The same FIG. 8 processing as well as the FIG. 5 construction can be achieved wherein the layer 18a is provided to have a thermal coefficient of expansion which is lower than the coefficient of expansion of the first phase crystalline material deposited on opposing wafer side.

Figure 9:
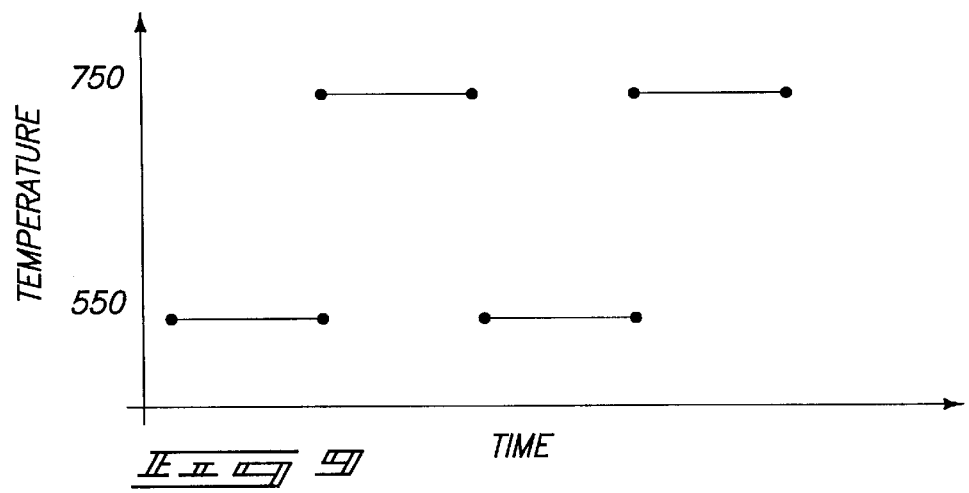
FIG. 9 is a graph of processing conditions as a function of time for yet a further exemplary embodiment of the invention.

FIG. 9 illustrates an exemplary reverse temperature relationship versus time processing for discrete depositions, whereby a later of the depositions is conducted at a higher temperature from an earlier of the depositions. The relationship would be as described above in the first described embodiments regarding continuous deposition and temperature change. Namely, where the stress-inducing material is formed over the wafer first side, it would have a thermal coefficient of expansion which is less than that of the crystalline material of the first crystalline phase being deposited on the same side. Where the crystalline phase material is being deposited on the opposing side, the stress-inducing material would be provided to have a thermal coefficient of expansion which is greater than that of the crystalline material of the first phase.

Formation of C54 crystalline phase refractory metal silicide may be inherently induced or seeded by deposition of a refractory metal silicide over a wide range of temperatures by depositing such refractory metal silicide layer directly onto an outer surface which already comprises C54 refractory metal silicide. It is believed that such layer can inherently induce refractory metal silicide material formation in the deposited silicide at conditions which might otherwise produce C49 phase silicide. Substrate temperature may be maintained substantially constant throughout such depositing, or alternately changed at least one during depositing. Further, depositing might be conducted continuously or in at least two discrete depositions conducted at different deposition temperatures.

Aspects of the above-described various embodiments might also be combined. Further, post deposition anneals at lower or higher temperatures can be applied to induce further high compressive stresses on the silicide films if desired to assure complete phase transformation to C54 phase silicon homogeneously throughout any deposited layer(s).

Figure 10:
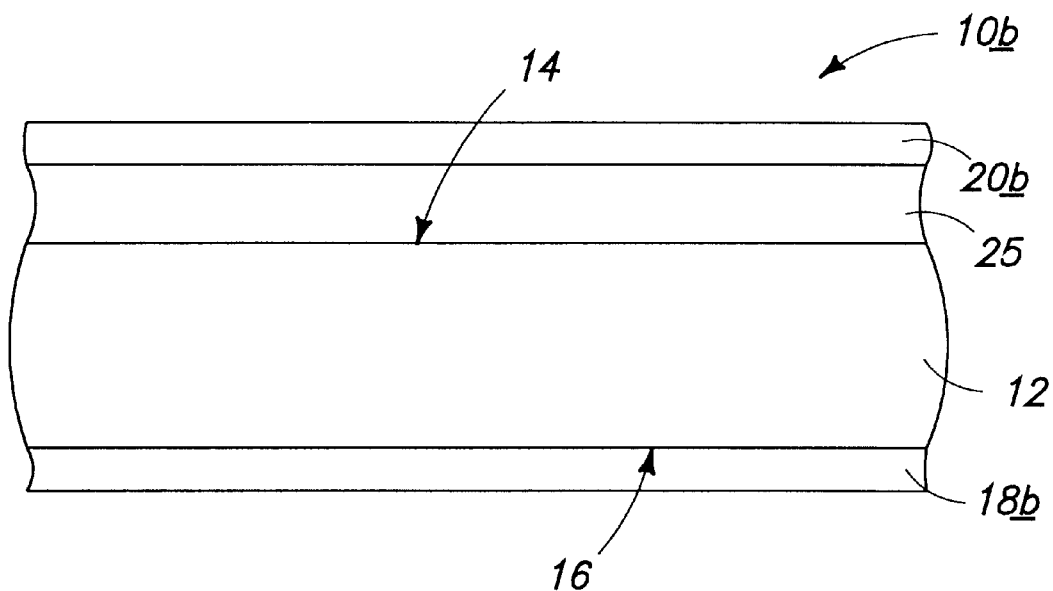
FIG. 10 is a diagrammatic sectional view of another semiconductor wafer fragment at one processing step in accordance with the invention.

The above described embodiments can be utilized in contact or any other technologies where refractory metal silicides or other crystalline materials are formed. A example embodiment in utilizing aspects of the above process in fabricating electrically conductive lines is described with reference to FIGS. 10 and 11. Like numerals from the first described embodiments are utilized where appropriate, with differences be indicated by the suffix "b", or with different numerals. Such processing utilizes back side stress-inducing material layer fabrication relative to an opposing side over which a conductive line is to be formed. An exemplary semiconductive material 25, such as conductively doped polysilicon, is illustrated as being supported by a substrate 12. Stress-inducing material layer 18b is fabricated on opposing or second wafer side 16 either before or after provision of layer 25. The above-described relationships would apply depending on starting and ending temperature for stress-inducing materials formed on the wafer back side. A crystalline phase material layer 20b would be deposited into electrical connection with semiconductive material layer 25 in some manner preferably whereby temperature is changed at least once during deposition to result in formation of the desired second crystalline phase refractory metal silicide.

Figure 11:
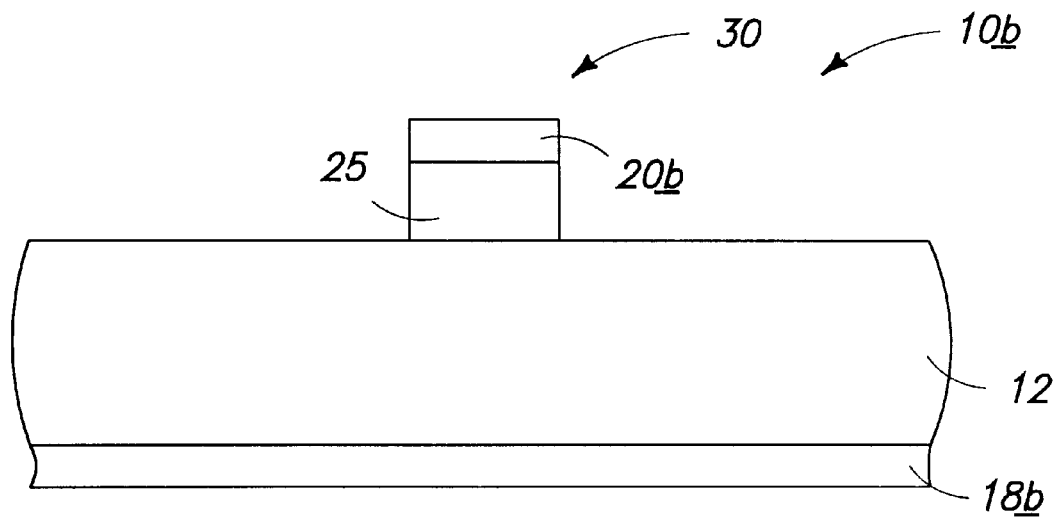
FIG. 11 is a view of the FIG. 10 wafer at a processing step subsequent to that shown by FIG. 10.

Referring to FIG. 11, and ideally after forming the second crystalline phase refractory metal silicide material, the semiconductor material and refractory metal silicide layer are patterned into the illustrated conductive line 30. Layer 18b might remain or be removed from the illustrated wafer. Further, gate oxide could also be provided intermediate semiconductive material layer 25 and substrate 12 for formation of a field effect transistor gate. Other uses of the invention also exist as will be appreciated by the artisan.

The above described exemplary processes contended with first and second crystalline phases, where the second crystalline phase was more dense than the first. In such instances, stress imparted to the crystalline phase material will ideally be in the form of compressive stress. Yet the invention also contemplates methods where the second crystalline phase is less dense than the first. In such instances, all of the above described relationships of the preferred embodiments with respect to both sides of the wafer will be reversed, with the stress imparted ideally being in the form of tensile stress for enhancing production of the lower density material of the second phase.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a second crystalline phase of a crystalline phase material capable of first and second crystalline phases, where said first and second phases have different densities, the method comprising:

providing a stress inducing material on a substrate; and after providing the stress inducing material on the substrate, depositing a crystalline phase material over the substrate in a substantially continuous manner and changing deposition temperature at least once during the depositing, and forming the second crystalline phase of the crystalline phase material.

2. The method of claim 1 wherein the second density is greater than the first density.

3. The method of claim 1 wherein the second density is greater than the first density, and the stress inducing material imparts compressive stress during the temperature changing.

4. The method of claim 1 wherein the second density is less than the first density.

5. The method of claim 1 wherein the second density is less than the first density, and the stress inducing material imparts tensile stress during the temperature changing.

6. The method of claim 1 comprising changing the deposition temperature at least twice during the depositing.

7. The method of claim 1 comprising changing the deposition temperature at least three times during the depositing.

8. The method of claim 1 wherein an average of the temperatures during all of the depositing and forming is less than or equal to about 700° C.

9. The method of claim 1 wherein the crystalline material comprises $TiSi_x$, the first crystalline phase is C49, the second crystalline phase is C54, and the stress inducing material comprises TiN.

10. The method of claim 1 wherein the crystalline material comprises $TiSi_x$, the first crystalline phase is C49, the second crystalline phase is C54, and the stress inducing material comprises $Si_3N_4$.

11. A method of forming a second crystalline phase of a crystalline phase material capable of first and second crystalline phases, where said first and second phases have different densities, the method comprising:

providing a stress inducing material on a substrate; and after providing the stress inducing material on the substrate, forming a crystalline phase material over the substrate in at least two discrete crystalline phase material depositions, a later of the depositions being conducted at a different temperature from an earlier of the depositions and forming the second crystalline phase of the crystalline phase material.

12. The method of claim 11 wherein the second density is greater than the first density.

13. The method of claim 11 wherein the second density is less than the first density.

14. The method of claim 11 comprising at least four discrete depositions comprising at least two different deposition temperatures.

15. The method of claim 11 comprising at least four discrete depositions, and changing the deposition temperature at least three times.

16. The method of claim 11 comprising at least four discrete depositions, and changing the deposition temperature at least three times collectively between said at least four discrete depositions.

17. The method of claim 11 wherein an average of the temperatures during all of the depositing and forming is less than or equal to about 700° C.

18. The method of claim 11 wherein the crystalline material comprises $TiSi_x$, the first crystalline phase is C49, the second crystalline phase is C54, and the stress inducing material comprises TiN.

19. The method of claim 11 wherein the crystalline material comprises $TiSi_x$, the first crystalline phase is C49, the second crystalline phase is C54, and the stress inducing material comprises $Si_3N_4$.

20. A method of forming an electrically conductive line comprising:

forming a semiconductive material supported by a substrate;

forming a stress inducing material supported by the substrate;

after forming the stress inducing material, depositing a refractory metal silicide in a substantially continuous manner into electrical connection with the semiconductive material, said refractory metal silicide being capable of first and second crystalline phases with the second phase being more dense than the first phase, the depositing comprising changing deposition temperature at least once during the depositing and forming the second crystalline phase refractory metal silicide; and after forming the second crystalline phase refractory metal silicide, patterning the semiconductive material and the refractory metal silicide into a conductive line.

21. The method of claim 20 comprising changing the deposition temperature more than once during the depositing.

22. The method of claim 20 wherein an average of the temperatures during all of the depositing and forming is less than or equal to about 700° C.

23. A method of forming an electrically conductive line comprising:

forming a semiconductive material supported by a substrate;

forming a stress inducing material supported by the substrate;

after forming the stress inducing material, depositing a refractory metal silicide in at least two discrete refractory metal silicide depositions into electrical connection with the semiconductive material, said refractory metal silicide being capable of first and second crystalline phases with the second phase being more dense than the first phase, a later of the depositions being conducted at a different temperature from an earlier of the depositions, and forming the second crystalline phase refractory metal silicide; and after forming the second crystalline phase refractory metal silicide, patterning the semiconductive material and the refractory metal silicide into a conductive line.

24. The method of claim 23 comprising at least four discrete depositions comprising at least two different deposition temperatures.

25. The method of claim 23 comprising at least four discrete depositions, and changing the deposition temperature at least three times.

26. The method of claim 23 comprising at least four discrete depositions, and changing the deposition temperature at least three times collectively between said at least four discrete depositions.

27. The method of claim 23 wherein an average of the temperatures during all of the depositing and forming is less than or equal to about 700° C.

28. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer first side, the stress inducing material having a thermal coefficient of expansion which is greater than that of the crystalline material of the first crystalline phase; and after forming the stress inducing material, depositing a crystalline phase material over the wafer first side in a substantially continuous manner and lowering deposition temperature at least once during the depositing, and forming the second crystalline phase of the crystalline phase material.

29. The method of claim 28 comprising changing the deposition temperature more than once during the depositing.

30. The method of claim 28 wherein an average of the temperatures during all of the depositing and forming is less than or equal to about 700° C.

31. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer second side, the stress inducing material having a thermal coefficient of expansion which is less than that of the crystalline material of the first crystalline phase; and after forming the stress inducing material, depositing a crystalline phase material over the wafer first side in a substantially continuous manner and lowering deposition temperature at least once during the depositing, and forming the second crystalline phase of the crystalline phase material.

32. The method of claim 31 comprising changing the deposition temperature more than once during the depositing.

33. The method of claim 31 wherein an average of the temperatures during all of the depositing and forming is less than or equal to about 700° C.

34. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer first side, the stress inducing material having a thermal coefficient of expansion which is less than that of the crystalline material of the first crystalline phase; and after forming the stress inducing material, depositing a crystalline phase material over the wafer first side in a substantially continuous manner and raising deposition temperature at least once during the depositing, and forming the second crystalline phase of the crystalline phase material.

35. The method of claim 34 comprising changing the deposition temperature more than once during the depositing.

36. The method of claim 34 wherein an average of the temperatures during all of the depositing and forming is less than or equal to about 700° C.

37. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer second side, the stress inducing material having a thermal coefficient of expansion which is greater than that of the crystalline material of the first crystalline phase; and after forming the stress inducing material, depositing a crystalline phase material over the wafer first side in a substantially continuous manner and raising deposition temperature at least once during the depositing, and forming the second crystalline phase of the crystalline phase material.

38. The method of claim 37 comprising changing the deposition temperature more than once during the depositing.

39. The method of claim 37 wherein an average of the temperatures during all of the depositing and forming is less than or equal to about 700° C.

40. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer first side, the stress inducing material having a thermal coefficient of expansion which is greater than that of the crystalline material of the first crystalline phase; and after forming the stress inducing material, depositing a crystalline phase material over the wafer first side in at least two discrete crystalline phase material depositions, a later of the depositions being conducted at a lower temperature from an earlier of the depositions and forming the second crystalline phase of the crystalline phase material.

41. The method of claim 40 comprising at least four discrete depositions comprising at least two different deposition temperatures.

42. The method of claim 40 comprising at least four discrete depositions, and changing the deposition temperature at least three times.

43. The method of claim 40 comprising at least four discrete depositions, and changing the deposition temperature at least three times collectively between said at least four discrete depositions.

44. The method of claim 40 wherein an average of the temperatures during all of the depositing and forming is less than or equal to about 700° C.

45. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer second side, the stress inducing material having a thermal coefficient of expansion which is less than that of the crystalline material of the first crystalline phase; and after forming the stress inducing material, depositing a crystalline phase material over the wafer first side in at least two discrete crystalline phase material depositions, a later of the depositions being conducted at a lower temperature from an earlier of the depositions and forming the second crystalline phase of the crystalline phase material.

46. The method of claim 45 comprising at least four discrete depositions comprising at least two different deposition temperatures.

47. The method of claim 45 comprising at least four discrete depositions, and changing the deposition temperature at least three times.

48. The method of claim 45 comprising at least four discrete depositions, and changing the deposition temperature at least three times collectively between said at least four discrete depositions.

49. The method of claim 45 wherein an average of the temperatures during all of the depositing and forming is less than or equal to about 700° C.

50. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer first side, the stress inducing material having a thermal coefficient of expansion which is less than that of the crystalline material of the first crystalline phase; and after forming the stress inducing material, depositing a crystalline phase material over the wafer first side in at least two discrete crystalline phase material depositions, a later of the depositions being conducted at a higher temperature from an earlier of the depositions and forming the second crystalline phase of the crystalline phase material.

51. The method of claim 50 comprising at least four discrete depositions comprising at least two different deposition temperatures.

52. The method of claim 50 comprising at least four discrete depositions, and changing the deposition temperature at least three times.

53. The method of claim 50 comprising at least four discrete depositions, and changing the deposition temperature at least three times collectively between said at least four discrete depositions.

54. The method of claim 50 wherein an average of the temperatures during all of the depositing and forming is less than or equal to about 700° C.

55. A method of forming a second crystalline phase of a crystalline phase material capable of first and second crystalline phases, where said second phase is more dense than said first phase, where the crystalline material of the first crystalline phase has a thermal coefficient of expansion, the method comprising:

providing a semiconductor wafer having opposing first and second sides;

forming stress inducing material over the wafer second side, the stress inducing material having a thermal coefficient of expansion which is less higher that of the crystalline material of the first crystalline phase; and after forming the stress inducing material, depositing a crystalline phase material over the wafer first side in at least two discrete crystalline phase material depositions, a later of the depositions being conducted at a higher temperature from an earlier of the depositions and forming the second crystalline phase of the crystalline phase material.

56. The method of claim 55 comprising at least four discrete depositions comprising at least two different deposition temperatures.

57. The method of claim 55 comprising at least four discrete depositions, and changing the deposition temperature at least three times.

58. The method of claim 55 comprising at least four discrete depositions, and changing the deposition temperature at least three times collectively between said at least four discrete depositions.

59. The method of claim 55 wherein an average of the temperatures during all of the depositing and forming is less than or equal to about 700° C.

60. A method of forming a second crystalline phase of a crystalline phase material capable of first and second crystalline phases, where said first and second phases have different densities, the method comprising:

providing a stress inducing material on a substrate; and after providing the stress inducing material on the substrate, depositing a crystalline phase material over the substrate in a substantially continuous manner and substantially continuously changing deposition temperature between an initial first higher temperature and a second lower temperature during at least a portion of the depositing, and forming the second crystalline phase of the crystalline phase material.

61. The method of claim 60 wherein the second density is greater than the first density.

62. The method of claim 60 wherein the second density is greater than the first density, and the stress inducing material imparts compressive stress during the temperature changing.

63. The method of claim 60 wherein the second density is less than the first density.

64. The method of claim 60 wherein the second density is less than the first density, and the stress inducing material imparts tensile stress during the temperature changing.

65. The method of claim 60 comprising changing the deposition temperature more than once during the depositing.

66. The method of claim 60 wherein an average of the temperatures during all of the depositing and forming is less than or equal to about 700° C.

67. A method of forming a second crystalline phase of a crystalline phase material capable of first and second crystalline phases, where said first and second phases have different densities, the method comprising:

providing a stress inducing material on a substrate; and after providing the stress inducing material on the substrate, depositing a crystalline phase material over the substrate in a substantially continuous manner and substantially continuously changing deposition temperature between an initial first lower temperature and a second higher temperature during at least a portion of the depositing, and forming the second crystalline phase of the crystalline phase material.

68. The method of claim 67 wherein the second density is greater than the first density.

69. The method of claim 67 wherein the second density is greater than the first density, and the stress inducing material imparts compressive stress during the temperature changing.

70. The method of claim 67 wherein the second density is less than the first density.

71. The method of claim 67 wherein the second density is less than the first density, and the stress inducing material imparts tensile stress during the temperature changing.

72. The method of claim 67 comprising changing the deposition temperature more than once during the depositing.

73. The method of claim 67 wherein an average of the temperatures during all of the depositing and forming is less than or equal to about 700° C.

74. A method of forming a refractory metal silicide comprising:

forming a refractory metal silicide layer of C54 crystalline phase on a substrate; and depositing refractory metal silicide material onto the C54 refractory metal silicide layer with the C54 crystalline phase being induced into the refractory metal silicide material from the C54 crystalline phase in the refractory metal silicide layer.

75. The method of claim 74 wherein substrate temperature is maintained substantially constant throughout the depositing.

76. The method of claim 74 wherein substrate temperature is changed at least once during the depositing.

77. The method of claim 74 wherein said depositing occurs in at least two discrete depositions conducted at different deposition temperatures.

* * * * *